United States Patent [19]

Poupaert et al.

[11] Patent Number: 4,748,365

[45] Date of Patent: May 31, 1988

[54] METHOD AND APPARATUS FOR SUPPLYING ELECTRIC POWER TO A VIBRATION GENERATOR TRANSDUCER

[75] Inventors: Jean-Pierre Poupaert, Armentieres; Bernard Thirion, Marquette, both of France

[73] Assignee: Institut Superieur d'Electronique du Nord (ISEN), Lille, France

[21] Appl. No.: 901,050

[22] Filed: Aug. 27, 1986

[30] Foreign Application Priority Data

Aug. 27, 1985 [FR] France ................................ 85 13032

[51] Int. Cl.[4] ................................ H01L 41/08

[52] U.S. Cl. ................................ 310/316; 318/116

[58] Field of Search ........................ 310/314, 316, 317; 318/116, 118

[56] References Cited

U.S. PATENT DOCUMENTS

| | | | |
|---|---|---|---|
| 4,275,363 | 6/1981 | Mishiro et al. | 331/4 |
| 4,371,816 | 2/1983 | Wieser | 318/116 |
| 4,445,063 | 4/1984 | Smith | 310/316 |
| 4,468,581 | 8/1984 | Okada et al. | 310/316 |
| 4,551,690 | 11/1985 | Quist | 310/316 X |
| 4,554,477 | 11/1985 | Ratcliff | 310/316 |
| 4,562,413 | 12/1985 | Mishiro et al. | 310/316 X |
| 4,577,500 | 3/1986 | Mishiro | 73/579 |
| 4,626,728 | 12/1986 | Flachenecker et al. | 310/316 |

FOREIGN PATENT DOCUMENTS 3428523 2/1985 Fed. Rep. of Germany .

2336912 12/1976 France .

*Primary Examiner*—Mark O. Budd

*Attorney, Agent, or Firm*—Kerkam, Stowell, Kondracki & Clarke

[57] ABSTRACT

The invention relates to a method for supplying electric power to a transducer for generating sonic or ultrasonic vibrations.

It is characterized in that in the automatic control stage, the control device (11) is kept within said command and control loop and, by means of its processor and as a function of the data furnished to this processor and in particular data emitted by the analyisis means (6–8) furnishing the phase displacement ($D_f$) and the direction ($S_f$) of the phase displacement between the current (I) and the voltage (U) of the power supply of the transducer, adapter control signals (12) are processed, each of which determines an output frequency and by way of which, not taking into account anything but the possible existence of a phase displacement requiring correction, whatever the value and the direction of this phase displacement, the progressive modification of the frequency is commanded, in the direction dictated by the direction of the phase displacement, until arriving at one of two situations, which are either the disappearance of the difference of the phases requiring correction, or the arrival at a previously fixed limit of the modification of the frequencies since the frequency at the beginning of this modification.

15 Claims, 2 Drawing Sheets

METHOD AND APPARATUS FOR SUPPLYING ELECTRIC POWER TO A VIBRATION GENERATOR TRANSDUCER

The invention relates to a method and an apparatus for supplying electric power to a transducer for generating sonic and ultrasonic vibrations.

For the transducer to behave in a certain manner, for example as a purely resistive load without effecting any phase displacement between the voltage and the current, rather than a more inductive or capacitive load, it is known that the supply frequency must be determined with respect to the resonant frequency of the acoustic line or carrier comprising the transducer load, such as a tool, and more precisely with respect to one of the two resonant frequencies present, that is, a series resonant frequency and a parallel resonant frequency, called an anti-resonant frequency.

A search is then done to find which of these resonant frequencies pertains to each acoustic line supplied by the apparatus.

To this end, use is made of the property according to which, at these resonant frequencies, the phase displacement between the voltage and the supply current is zero.

To accomplish this, the frequency of this power supply is modified progressively while the displacement between the voltage and the supply current is being measured, thereby scanning a certain frequency range until stopping at the frequency at which the displacement becomes zero.

The corresponding frequency is then retained as the reference frequency for the corresponding acoustic line when it is used under search conditions.

For this search stage, most known apparatuses use a voltage-controlled oscillator, which emits a signal the frequency of which is a function of the control voltage applied to it and which originates in a control device which is either manual or more usually automatic, an example being a microcomputer.

This microcomputer then receives either signals representing the current and the voltage, from a continuous sampling device, or, from a phase comparator, a signal representing the phase displacement between the above-mentioned signals; the data received by the microcomputer are converted from their original analog form into digital form that the microcomputer can accept, and similarly its output instructions are converted from their originally digital form into an analog form that is compatible with the controlled oscillator.

However, converting from analog to digital form, in particular, necessitates stabilizing the result prior to using it; this particularly slows down the process of searching for the tuning frequency, if errors are to be avoided.

The use of an oscillator controlled by a voltage also involves errors associated with the drift of this oscillator.

When at least one of the resonant frequencies of an acoustic line has been identified, then for this acoustic line to be used, its power supply must operate at a working or driving frequency determined with reference to this resonant frequency, but it must also be taken into account that this reference frequency is valuable only under the conditions of the stage in the search, and that a new frequency must be sought, for instance, in the event the power supplied increases and/or the tool load increases, but also, in response to external factors such as temperature drift, humidity, and so forth.

This is why all the known embodiments (German Patent Application DE-A No. 34 28 523 and U.S. Pat. No. 4,275,363) have not only a method and apparatus for first seeking at least one of the reference frequencies, but also a method and apparatus for automatic control, to assure that the power supply of the transducer is subsequently adjusted, based on the reference frequency, as a function of the impact on the phase displacement of the development of conditions that prevailed in the search stage.

For this automatic control, in all the known apparatuses use was made of a circuit comprising a phase locked loop, or functioning as such; that is, instead of the control voltage processed by the control means which when effected the frequency sweep during the search stage, the controlled oscillator receives an analog signal representing the more or less significant modification of the displacement between the voltage and the current of the transducer power supply, in order to attempt, by way of the controlled oscillator, to arrive at an adequate correction of the frequency, which of course requires that the frequency have practically no time to change in the meantime.

To this end, this analog signal is processed by the phase comparator.

Nevertheless, since such a phase locked loop can produce only limited voltages, it can adjust only for developments that remain within very narrow limits of magnitude and speed, because:

the adjustment range is fixed and narrow and for example does not always allow variations in power and/or load without going through a new search stage; and the loop has a reaction speed that varies with the scale of the adjustment that is to be done.

For this reason, the known embodiments have been used only in applications where the developments of the conditions of the search stage and/or their impact on the phase displacement remain fundamentally within such limits in terms of their scale and/or speed.

Accordingly, in order to limit the development of conditions affecting the tuning frequency, the application of the apparatus is restricted to tasks where it needs to be used only intermittently and at low power, such as soldering and stripping, so that among other purposes the temperature drifts of the transducer and the loop, which destroy the stability of the frequency, can be limited; and in order to limit the development of phase displacement due to the development of the conditions of the search stage, work is preferably done only at the series resonant frequency, around which the frequency variations, which are a function of the development of the above-mentioned conditions, are of less magnitude and are slower than around the parallel resonant frequency, with the incidental advantage that at the series frequency the current is elevated, and hence the current and the voltage both can be easily measured so as to control the phase displacement, even if adopting this series resonant frequency does have the disadvantage that the available power is less during work, when it is necessary, than during repose, when it can only bring about needless heating and attendant transducer drift.

With such phase locked loop apparatuses, it is no longer possible to take account of a tolerance or deviation between the work frequency and the reference frequency, for example in order to limit the adjustment actions.

Given the narrowness of the adjustment limits this loop permits, which are for instance monitored by a window comparator, these limits are often exceeded, and the automatic control process and hence the functioning of the transducer must be frequently interrupted to return to a search position, which is highly disruptive in terms of production.

In view of the above, it will be understood that particularly because of their automatic control loop, the previously known power supply apparatuses are not at all suited to when their transducer must, on the one hand, operate at high power and hence with uneven variations in speed and magnitude of the resonant frequency but also, on the other hand, in a durable if not continuous manner, with the particular consequence of heating and wear of the sonotrode, which again causes major variations in the resonant frequency.

This unsuitability is also due to the fact that given their magnitude, the changes in frequency can exceed the existing frequency deviation, which is on the order of only a few tens of Hertz, between the series and parallel resonant frequencies and can then enter a frequency zone in which the phase displacement has an algebraic sign like that of a change in the other direction, which then causes the loop to perform a correction that is the opposite of which is actually necessary.

An object of the invention is a method and an apparatus for electric power supply to a transducer with which the tuning of the work frequency responds to fast and major modifications of this frequency.

Another object of the invention is a method and an intelligent apparatus which while following up both fast and major modifications in the resonant frequency allows them not to be taken into account except within a certain limit that is defined beforehand.

Another object of the invention is a method and an apparatus such that with them the tuning is precise enough to make reference to both the series resonant frequency and the parallel resonant frequency, where the power under load is greater than at rest and where the maximum power is therefore furnished at the useful time when work is being done, hence producing optimum output, even though at this frequency the current is very weak and is difficult to measure.

Still another object is a method and an apparatus such that applications requiring different frequencies and different power are possible, for example not only for tasks requiring high power, such as machining and assistance in electroerosion, electrochemical polishing and extrusion, but also for traditional tasks such as soldering and stripping.

To this end, the subject of the inventon is a method of the above-described type, characterized in particular in that during the automatic-control stage, instead of disconnecting the control device and closing the command and control loop to make it function like a phase locked loop, the control device is kept within this command and control loop, and by means of its processor and as a function of the data furnished to this processor, and in particular data emitted by analysis means and relating to phase displacement and the direction of phase displacement between the current and the voltage of the transducer power supply, control signals of the adapter, each of them determining an output frequency, are processed, and by way of them, not taking anything into account but the possible existence of a phase displacement requiring correction, the progressive modification of the frequency is commanded, in the direction dictated by the direction of the phase displacement, until arriving at one of two situations, that is, either the disappearance of the difference in phases requiring correction, or the arrival at the previously fixed limit of the modification of the frequencies since the frequency at which this modification began.

The subject of the invention is likewise the power supply capable of performing the method.

The invention will be better understood with reference to the ensuing description of a non-limiting example, taken in conjunction with the drawings, which in schematic form shows the following:

BRIEF DESCRIPTION OF THE DRAWINGS

Referring now to FIG. 1, it is seen that in the apparatus, the main circuit 1 for electrical supply to a transducer 2 is provided in a known manner with means 3, known as continuous sampling means, which sample the signals U and I representing the supply current and voltage of the transducer 2. These means 3 are connected via lines 4, 5 to means 6–8 which analyze them and furnish data on the supply voltage and current and in particular on their phase displacement $D_f$ and on the direction $S_f$ of this displacement.

Figure 1:
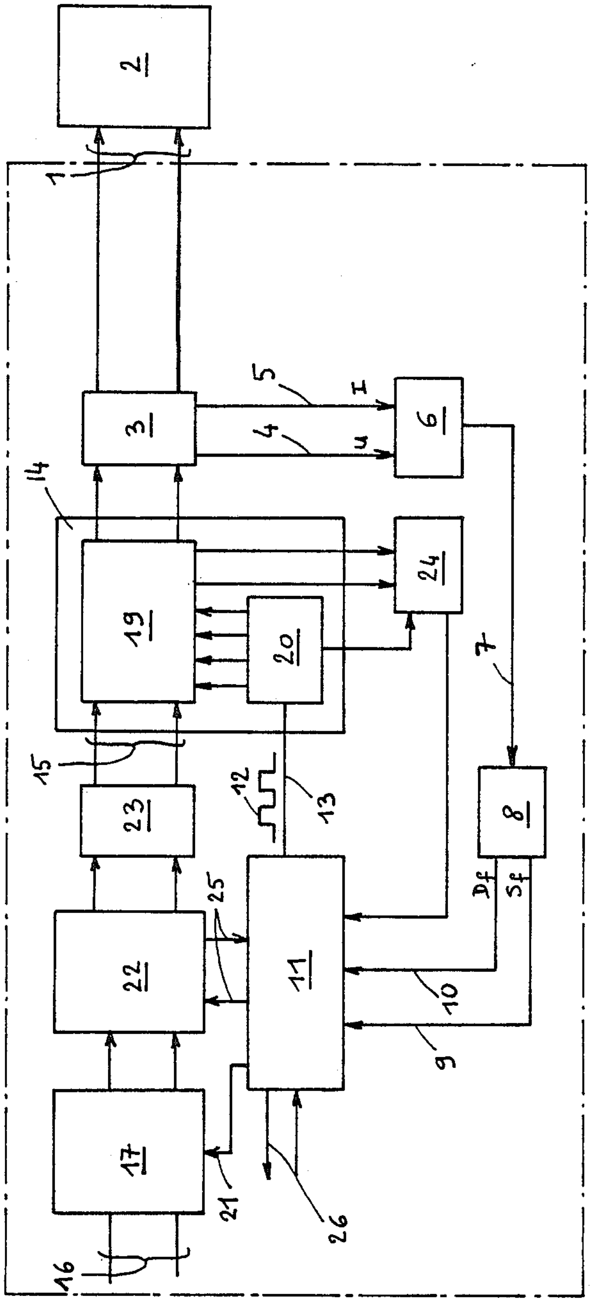
FIG. 1: the power supply and the transducer.
Figure 2:
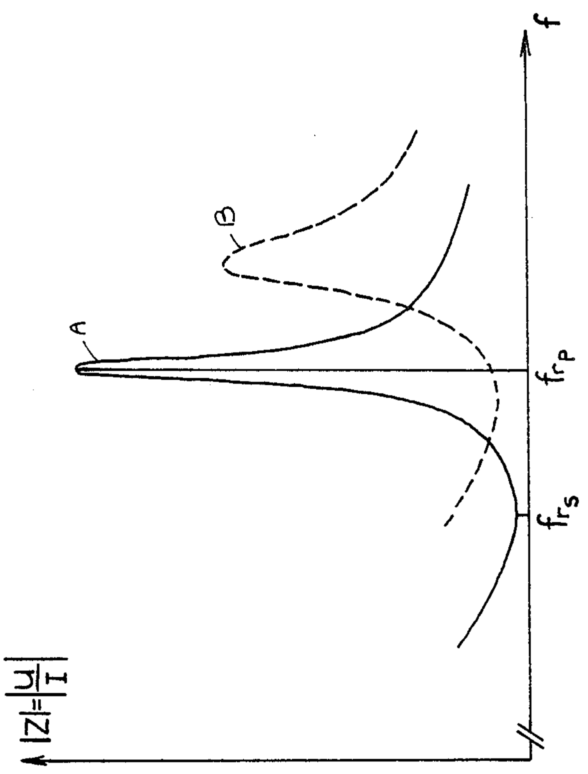
FIG. 2: impedance curves as a function of the frequency, one of them in a state of repose A and the other under load B, with a summary indication of the positions of the series resonant frequency $fr_s$ and the parallel resonant frequency $fr_p$.

The end of the main circuit 1 opposite the end connected to the transducer 2 is connected to the output of an adapter 14 which assures the electrical supply of this transducer 2.

This adapter has one main input 15 and one control input made and available through line 13.

The main input 15 of the adapter 14 is connected to the sector 16 via a suitable device 17, such as a rectifier and perhaps an autotransformer.

A circuit breaker 22 and perhaps an interference suppression device 23, such as an integrator circuit, may be interposed between the device 17 and the adapter 14.

In view of the step of searching for the tuning frequency of an acoustic line, the adapter 14 has its control input, which is connected via a line 13 to a control circuit device 11 including a processor and furnishing it with signals 12, each of them determining a different value of the output frequency of the adapter 14, which enables commanding a frequency sweep until the phase displacement is nullified.

In the case of a greatly damped load, such as in the case where water is present, for instance, the transducer 2 may lose its ability to resonate within the search frequency range, and in this situation the apparatus may not be able to find the tuning frequency despite a sweep during which the phase displacement has for instance varied between −90° and −20°, that is, over a range of 70° but without passsing through zero, or in other words through the tuning frequency.

In that case, for example under the influence of one of the analysis means 6–8, even the control device 11, a fictive phase displacement $C_f$ of for instance 30° is created between U and I, and at low power a second sweep is performed, which in the above example and because of the fictive phase displacement leads to a phase displacement of $-60°$ to $+10°$, which thus passes through zero degrees and hence through the tuning frequency.

In an instance that is outside the scope of this example, where the tuning frequency has not been found in the course of a second sweep, it will logically be possible to create a still larger fictive phase displacement and then to perform another sweep.

When the tuning frequency has been found, in order to make the adapter come into play following such a procedure the power is increased, in such a manner that the apparatus stays at the tuning frequency; then the fictive phase displacement is suppressed, which causes a real phase displacement to appear, in an opposite direction and with the same value, except that in the above-explained manner what the apparatus detects makes it possible to command an immediate readjustment.

In order to make the adapter 14 function at a working frequency determined with reference to the tuning frequency previously searched for and with reference to the development of working conditions, the apparatus is subjected to automatic control.

For this automatic control stage, the adapter 14 has its control input which receives signals 12 and to that end is connected via a circuit 9, 10 to analysis means 6, 7 and 8, so as in particular to form a loop, including the adapter 14, the main circuit 1, the lines 4, 5 and the analysis means 6–8, for command and control of the adapter 14.

According to an essential feature of the method according to the invention, in the automatic control stage, instead of disconnecting the control device 11 and closing the command and control loop 3–10 and 12–14 to make it function as a phase locked loop, the control device 11 is kept within the command and control loop and, by means of its processor and as a function of data furnished by the analysis means 6–8 and furnishing the phase displacement $D_f$ and the direction $S_f$ of phase displacement between the current I and the voltage U of the power supply to the transducer 2, signals 12 for controlling the adapter are processed, each of them determining an output frequency, and by way of them, not taking anything into account but the possible existence of a phase displacement requiring correction, whatever the value and direction of this phase displacement, the progressive modification of the frequency is commanded in the direction dictated by the direction of the phase displacement until arriving at one of two situations, that is, either the disappearance of the difference in phases requiring correction, or the arrival at the previously fixed limit of the modification of frequencies since the frequency at the beginning of this modification.

Naturally, at the working frequency of the transducer, the phase displacement is zero or is considered to be zero; obviously the corresponding frequency is not modified.

Contrarily, it will be noted that when it is not zero, by using the above-described method instead of the means of a phase locked loop, the real value and the direction of the phase difference measured between U and I are detected, and then a single voltage is generated which is a function of this real value and this direction, and finally, with this single voltage, the output frequency of a voltage-controlled oscillator is adapted, according to the invention, during the automatic control stage by not taking anything into account, at the level of the phase displacement, but the existance of a phase displacement such that it requires correction, whatever the value and direction of this displacement, the signals 12 determining the progressive modification of the power supply frequency by the adapter are processed with the aid of the processor of the control device 11. For example, at the level of the control device, in order to avoid overly hasty modifications, a phase displacement tolerance is allowed, within which this displacement is considered to be zero and does not need, or no longer needs, to be corrected.

It is equally possible to allow a greater variation of the phase displacement yet which is still limited in time, or to command functioning at a different working frequency from the reference frequency, and for which the correction is not, or is no longer, required.

As a function of the factors discussed at the outset above, the modifications in the position of the selected working frequency, for taking into account the development of working conditions during the automatic control of the apparatus, do naturally have limits, and by detecting any exceeding of these limits, abnormal function is detected, such as a machining malfunction, tool breakage or the like.

In a variant embodiment of the method according to the invention, during the automatic control of the apparatus the frequency modification is interrupted at at least one of these limits of normal functioning, and, optionally after a new attempt, a default signal is emitted, such as a visual or acoustic alarm and/or a command to stop the machinery. The position and the magnitude of the frequency modulation, the phase displacement tolerance and the normal functioning limits are determined, in accordance with the application, by a low-power analysis of the global load behavior and as a function of the frequency at which operation is desired.

In order to profit from optimum efficiency, the apparatus is preferably regulated such that the working frequency of the transducer corresponds to ther parallel resonant frequency, but as will be appreciated from the above description, the apparatus may equally well function at the resonant frequency or at any other frequency.

In particular, this method assures the following:

more-stable function;

phase adjustment in which the speed of the adjustment is independent of the amplitude of the phase displacement;

a capture range which does not have the inherent constraints of a phase locked loop and which is readjusted upon each frequency adjustment;

the processor card can furnish a signal having a more-stable frequency than a voltage-control oscillator can;

entirely automatic functioning of the apparatus for a given task;

an intelligent sequence of the working frequency by the recognition of modifications of this frequency limited in magnitude and in speed beyond which a modification is not commanded; and adaptability of the apparatus to all usages of power ultrasonics, and in particular to applications such as machining.

The processor card 11 offers a choice of programs adapted to each task as well as other advantages such a regulation and control of the power furnished to the transducer.

It is also possible to envisage extensions of the apparatus:

to dialogue with a machine tool;

to measurements of vibrations, of machining depth, of wear.

Instead of a circuit 3–10 and 12–14, from which the processor control device 11 is disconnected so as to function, with the adapter 16 and the analysis means, like a phase locked loop, the automatic control means of the power supply apparatus include a circuit 3–14 including the above-mentioned processor control device 11, the output of which, during automatic control, remains connected to the control input of the adapter 14 and furnishes it with signals 12, each of which determines an output frequency.

To this end, the analysis means 6–8 include a filter 6 assigned to retrieving the fundamental signal prior to addressing the means 8 via a circuit 7, the means 8 comprising a forming means 8 which analyzes it in order to extract from it the two data mentioned above, that is, the phase displacement Df on the one hand and the direction Sf of displacement, on the other, between U and I.

To have a highly stable frequency without measurement of this frequency being necessary, the control device 11 may include a synthesizer.

Rather than being a controlled oscillator, the adapter 14 preferably comprises at least one power inverter 19, the switches of which are controlled in succession by a card 20 as a function of the synthesis of the signals 12 received at its input, these signals preferably being digital in form.

The apparatus further includes means which can be integrated with the processor control devices, to assure power regulation 21 by intervening either at the device 17, by which the device is connected to the sector 16, if it includes a controlled rectifier or a variable autotransformer, or at the inverter 19.

The circuit breaker 22 can be controlled at various points, for example from a scope controller (voltmeter, ammeter), a set- point, the processor card of the device 11 or the default signal.

In addition to this protection offered by the circuit breaker, the inverters preferably have a limiter 24 which assures them individual and faster protection.

Realized in this manner, the apparatus as a whole is monitored and controlled by the processor card 11, which furnishes the principal frequency 12, the control means 21 for regulating the power and the circuit breaker means 22 through leads 25, the display means 26 which displays the tasks performed and the causes of stoppage.

We claim:

1. A method for supplying electric power to a transducer for generating sonic or ultrasonic vibrations by means of an apparatus, said apparatus having an adapter for adapting the frequency of the electric supply of the vibration transducer, continuous sampling means which sample signals representative of the current and voltage of the power supply to the vibration transducer, analyzing means for analyzing the signals and for providing analyzed data pertaining to the voltage signal and the current signal, and in particular on their phase displacement ($D_f$) and on the direction ($S_f$) of the phase displacement to a frequency adapter, the method comprising:

(a) continuously sampling the signals representative of the current and voltage of the power supply to the vibration transducer;

(b) analyzing said sampled signals to obtain data indicative of the phase displacement $D_f$ and the direction of the phase displacement $S_f$;

(c) providing said data indicative of said phase displacement $D_f$ and said direction of said displacement $S_f$ to a control circuit device;

(d) processing said data to obtain a value of a desired supply power frequency and providing said processed data to an adapter;

(e) searching for a tuning frequency of the adapter by means of a control input connected via a line to a control circuit device which progressively modifies the output frequency of the adapter by determining a different value of the output frequency of the adapter and commanding a first frequency modification sweep until the phase displacement $D_f$ is nullified so as to cause said adapter to function at a natural resonant frequency of the vibration transducer determined with reference to the tuning frequency previously searched for, whereby said control circuit device is kept within a command and control loop formed by said analyzing means, said control circuit device and said adapter and whereby said progressive modification of the frequency is commanded in the direction dictated by the direction of the phase displacement $S_f$.

2. The method according to claim 1, wherein the control device compensates for a phase displacement tolerance within which the phase displacement is considered to be zero and then is considered not to require any further modification.

3. The method according to claim 2 wherein the position and the magnitude of the frequency modification, the phase displacement tolerance and the limits of normal functioning are determined by a low-power analysis of the global behavior of the load.

4. The method according to claim 1 wherein said progressive frequency modification is interrupted upon reaching at least one of a predetermined set of limits.

5. The method according to any one of claims 1 or 2, wherein the steps of searching for said tuning frequency during said sweep over a certain range of frequencies further comprises combining a fictive phase displacement value ($C_f$) with said phase displacement $D_f$ between said current and said voltage of the power supply obtained in the analyzing step, performing another sweep at low power until said tuning frequency is found.

6. The method according to claim 5, further comprising a power increase step following the finding of said tuning frequency, wherein the power is increased in such a manner that said control circuit device maintains the tuning at said tuning frequency and suppresses said fictive phase displacement and said control circuit device compensates for the concurrent increase in the phase displacement $D_f$ created by said suppression.

7. An apparatus for supplying electric power to a transducer for generating sonic or ultrasonic vibrations having an electric supply power input for receiving electric power from a supply and an adapted supply power output, comprising:

(a) an adapter for adapting the frequency of the electric supply power having a main input and a control input;

(b) continuous sampling means for sampling signals representative of the current and voltage of the electric supply power to the transducer;

(c) analyzing means for analyzing the sampled signals representative of the voltage and the current of the electrical supply power of the transducer, and for obtaining a signal representative of the phase displacement ($D_f$) and the direction ($S_f$) of the phase displacement between the voltage and the current of the electrical supply power; and (d) processing means for receiving said signals $D_f$ and $S_f$, for calculating data indicative of the required adaptation of the power supply frequency so as to obtain a desired value of the power supply frequency, and for providing said data to said adapter, whereby said processing means is connected to said adapter and said adapter receives said calculated data from said processing means and utilizes said calculated data to determine a different value of the output frequency of the adapter, thus enabling the commanding of a frequency sweep until the phase displacement $D_f$ is nullified so as to cause said adapter to function at a a natural resonant frequency of the vibration transducer determined with reference to the tuning frequency previously searched for, said processing means remains connected to said control input of the adapter and furnishes it with signals determining an output frequency during the operation of the apparatus.

8. The apparatus according to claim 7, wherein the analysis means comprises a filter for retrieving the fundamental signal from said sampling means and a forming means for analyzing said fundamental signal to extract from it the said phase displacement ($D_f$) and said direction ($S_f$) of the phase displacement between the current and voltage of the electrical supply power.

9. The apparatus according to claim 7, wherein said processing device further comprises a synthesizer for providing a synthesized frequency to a vibration transducer having. a highly stable natural resonant frequency.

10. The apparatus according to claim 7, wherein said processing means comprises a means for power regulation connected to and in communication with at least one of said adaptor and the electric supply power input.

11. The method according to claim 4, wherein a further step of making a second sweep through a progressive modification of the tuning frequency is instituted if the said first frequency modification sweep is interrupted.

12. The method according to claim 1 wherein said step for processing said data and providing said processed data to an adapter includes processing by said control circuit device of said data obtained from said analyzing means to determine the modification required to the tuning frequency.

13. The method according to claim 1 wherein said processing step modifies said tuning frequency in accordance with parameters established by the natural resonant frequency of the vibration transducer, by the ambient conditions of operation, and by the power of the electric power supply.

14. The method according to claim 12 wherein said processing step further includes providing a tuning frequency which sweeps through a range of phase displacement $D_f$ values determinative of said greatest possible degree of correlation beween the output frequency of said adapter and the natural resonant frequency of the vibrational transducer.

15. The method according to claim 12 wherein said processing step further includes utilizing the direction of phase displacement $S_f$ as an indicator to determine the frequency range and direction of said frequency modification.

* * * * *